US006425113B1

(12) United States Patent
Anderson et al.

(10) Patent No.: US 6,425,113 B1
(45) Date of Patent: Jul. 23, 2002

(54) INTEGRATED VERIFICATION AND MANUFACTURABILITY TOOL

(76) Inventors: Leigh C. Anderson, 10155 SW. Riverwood La., Tigard, OR (US) 97224; Nicolas Bailey Cobb, 1632 Willow Lake La., San Jose, CA (US) 95131-3553; Laurence W. Grodd, 317 SE. 32nd Ave., Portland, OR (US) 97214; Emile Sahouria, 1632 Willow Lake La., San Jose, CA (US) 95131-3553

( * ) Notice: Subject to any disclaimer, the term of this patent is extended or adjusted under 35 U.S.C. 154(b) by 0 days.

(21) Appl. No.: 09/593,923

(22) Filed: Jun. 13, 2000

(51) Int. Cl.[7] ............................................... G06F 17/50
(52) U.S. Cl. .................................. 716/5; 716/4; 716/19
(58) Field of Search ........................... 716/4, 5, 19, 20, 716/21, 2

(56) References Cited

U.S. PATENT DOCUMENTS

| 5,182,718 | A | * | 1/1993 | Harafuji et al. | 364/490 |
| 5,663,893 | A | * | 9/1997 | Wampler et al. | 364/491 |
| 6,077,310 | A | * | 6/2000 | Yamamoto et al. | 716/19 |
| 6,120,952 | A | | 9/2000 | Pierrat et al. | 430/30 |
| 6,226,781 | B1 | * | 5/2001 | Nistler et al. | 716/19 |
| 6,243,855 | B1 | * | 6/2001 | Kobayashi et al. | 716/19 |

OTHER PUBLICATIONS

Chen et al., "Analysis of the Impact of Proximity Correction Algorithms on Circuit Performance," IEEE Trans. on Semiconductor Manufacturing, vol. 12, No. 3, Aug. 1999, pp. 313–322.*

Cook et al., "Pyramid—A Hierarchical, Rule–Based Approach Toward Proximity Effect Correction—Prt II: Correction," IEEE Trans. on Semiconductor Manufacturing, vol. 11, No. 1, Feb. 1998, pp. 117–128.*

Harafuji et al., "A Novel Hierarchical Approach for Proximity Effect Correction in Electron Beam Lithography," IEEE Trans. on CAD of ICs and Systems, Col. 12, No. 10, Oct. 1993, pp. 1508–1514.*

Kahng et al., "Subwavelength Lithography and its Potential Impact on Design and EDA," DAC '99, pp. 799–804.*

Lee et al., "Pyramid—A Hierarchical, Rule–Based Approach Toward Proximity Effect Correction—Part I: Exposure Estimation," IEEE Trans. on Semiconductor Manufacturing, vol. 11, No. 1, Feb. 1998, pp. 108–116.*

Park et al., "An Efficient Rule–based OPC Approach Using a DRC Tool for 0.18 m ASIC," Proc. IEEE 1st Inti'l Symposium on Quality Design, Mar. 2000, no page numbers.*

Yamamoto et al., "Hierarchical Optical Proximity Correction on Contact Hole Layers," Int'l Microprocesses and Nanotechnology Conference, Jul. 2000, pp. 40–41.*

"IEEE Standard VHDL Language Reference Manual," ANSI Standard 1076–1993, Published Jun. 6, 1994.

"IEEE Standard Hardware Description Language Based on the Verilog Hardware Description Language," IEEE Standard 1364–1995, Published Oct. 14, 1996.

* cited by examiner

Primary Examiner—Matthew Smith
Assistant Examiner—Leigh Marie Garbowski
(74) Attorney, Agent, or Firm—Blakely Sokoloff Taylor & Zafman LLP

(57) ABSTRACT

An integrated verification and manufacturability provides more efficient verification of integrated device designs than verification using several different verification tools. The integrated verification and manufacturability includes a hierarchical database to store design data accessed by multiple verification tool components (e.g., layout versus schematic, design rule check, optical process correction, phase shift mask assignment). The hierarchical database includes representations of one or more additional, or intermediate layer structures that are created and used by the verification tool components for operations performed on the design being verified. Use of a single hierarchical database for multiple verification steps streamlines the verification process, which provides an improved verification tool.

45 Claims, 7 Drawing Sheets

INTEGRATED VERIFICATION AND MANUFACTURABILITY TOOL

FIELD OF THE INVENTION

The invention relates to design tools for integrated device layouts. More particularly, the invention relates to an integrated tool for use in modifying and verifying integrated device layouts.

BACKGROUND OF THE INVENTION

Large scale integrated circuits or other integrated devices are designed through a complex sequence of transformations, that convert an original performance specification into a specific circuit structure. Automated software tools are currently used for many of these design transformations. A common high level description of the circuit occurs in languages such as VHDL and Verilog®. One embodiment of VHDL is described in greater detail in "IEEE Standard VHDL Language Reference Manual," ANSI Std. 1076–1993, Published Jun. 6, 1994. One embodiment of Verilog® is described in greater detail in IEEE Standard 1364–1995. The description of the circuit at this stage is often called a "netlist".

Automated tools exist to convert this netlist into a physical layout for the circuit. FIG. 1 illustrates one approach to conversion of the netlist to a physical layout. The layout defines the specific dimensions of the gates, isolation regions, interconnects, contacts, and other device elements that form the physical devices, and usually represents these shapes with polygons defining their boundaries.

The layout typically contains data layers that correspond to the actual layers to be fabricated in the circuit. The layout also contains cells, which define sets of particular devices within the circuit. Cells typically contain all the polygons on all the layers required for the fabrication of the devices it contains. Cells can be nested within other cells, often in very intricate arrangements. The structure of cells is often called a data hierarchy. Typical formats for the polygons of a physical layout are GDS II, or CIF.

Once the layout is created, the layout is verified to insure that the transformation from netlist to layout has been properly executed and that the final layout created adheres to certain geometric design rules. These two checks are often called LVS (layout versus schematic) and DRC (design rule check), respectively. To perform this verification step, several products have been created, including DRACULA™ from Cadence Design Systems of San Jose, California, HERCULES™ from Avant! Corporation of Fremont, Calif., and CALIBRE® from Mentor Graphics of Wilsonville, Oreg. When anomalies or errors are discovered by these checking tools, the designer must then repair the fault before the layout is sent to a mask shop for mask manufacturing and wafer fabrication.

An additional checking step can also be used for layout verification. FIG. 2 illustrates an enhanced approach to conversion of the netlist to a physical layout. This provides a simulation based software engine that predicts what manufacturing distortions will occur during lithographic patterning. If the magnitude of these errors is determined to be significant, corrections are made using some form of Optical and Process Correction (OPC). OPC can correct for image distortions, optical proximity effects, photoresist kinetic effects, etch loading distortions, and other various process effects. Phase-shifting features can also be added to the layout at this point to enhance contrast.

Examples of this kind of checking and correction can be found in "Automated Determination of CAD Layout Failures Through Focus: Experiment and Simulation", by C. Spence et. al, in Optical/Laser Microlithography VII, Proc. SPIE 2197, p.302 ff (1994), and "OPTIMASK: An OPC Algorithm for Chrome and Phase-shift Mask Design" by E. Barouch et al. in Optical/Laser Microlithography VIII, Proc SPIE 2440, p.192 ff (1995). The prior art techniques mentioned above comprise operating on the layout with a series of distinct software tools that execute all the required steps in sequence.

FIG. 3 is a conceptual illustration of an example of such a prior art process of integrated circuit (IC) design verification and correction. Each of the required process steps is executed by a stand-alone software tool. Original IC layout 300 describes the physical circuit layers from which masks and/or reticles are created to realize the circuit described by the design layout. The original IC layout 300 can be, for example, a GDS-II description of the circuit to be manufactured.

Data import process 310 converts original IC layout 300 to a format for storage in verification database 315. The data, as stored in verification database 315, is used by layout versus schematic (LVS) tool 320 and design rule checking (DRC) tool 325 to verify the design of original IC layout 300. Upon completion of LVS and DRC verification, the data stored in verification database 315 is exported by data export process 330.

The data is then imported by data import process 335, which converts the exported data to a format used for phase shift mask (PSM) database 340. PSM tool 345 operates on the data stored in PSM database 340 to perform phase shifting where appropriate. Examples of a stand alone PSM assignment tools are SEED, discussed in the reference by Barouch, above, and the iN-Phase™ product available from Numerical Technologies of San Jose, Calif. The data describing the phase shifted layout(s) are exported from PSM database 340 by data export process 350.

Data import process 355 imports the data generated by the PSM tool to optical process correction (OPC) database 360. OPC database 360 is typically a flat database, meaning that all the polygons of a layer of the circuit are contained within a single cell, with no hierarchical structure. Data import process 355 typically converts data from a hierarchical representation to a flat representation. OPC tool 365 performs OPC operations on the data stored in OPC database 360. Examples of a stand alone OPC tools are OPTIMASK, discussed in the reference by Barouch, above, and Taurus™ available from Avant! Corporation. Data export process 370 exports the data stored in OPC database 360.

The data generated by the OPC tool is then typically imported into a simulation tool, to confirm that the OPC will have the desired corrective effect. This is sometimes called an optical and process rule check, or ORC. Once this check is complete, the data is exported for use in IC manufacturing process 395. As a final verification step, LVS tool 320 and/or DRC tool 325 can also be used on the output of OPC database 360. Performing another check with LVS tool 320 and/or DRC tool 325 requires another import and export by data import process 310 and data export process 330, respectively.

Several problems exist with respect to the process illustrated in FIG. 3. For example, the importation and the exportation of data to and from each tool provides an opportunity for error in the form of loss, or inaccurate translation, of data. The importation and the exportation of large datasets now common for VLSI ICs is also time consuming, where a single import or export step can last several hours. The more complex an integrated circuit design, the more time consuming the importation and exportation steps become. It is therefore desirable to have an new verification tool, in which all the required operations can be preformed, but where the risk of inaccurate translation is eliminated, and the many time consuming import and export steps are not required.

SUMMARY OF THE INVENTION

An integrated verification and manufacturability tool having a hierarchical database to represent at least a portion of an integrated device layout in a hierarchical or flat manner, which is used not only for standard DRC and LVS verifications, but is also capable of performing optical and process correction (OPC) and other data manipulation techniques, including phase-shifting mask (PSM) assignment and silicon simulation for optical and process rule checking (ORC).

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

An integrated verification and manufacturability is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Methods and apparatuses are described herein with respect to integrated circuit manufacturing; however, the techniques described can be applied to the manufacturing and/or design process of any integrated device. Integrated devices include integrated circuits, micromachines, thin film structures such as disk drive heads, gene chips, microelectromechanical systems (MEMS), or any other article of manufacture that is manufactured using lithography techniques.

An integrated verification and manufacturability provides more efficient verification of integrated device designs than verification using several different verification tools. The integrated verification and manufacturability includes a hierarchical database to store design data accessed by multiple verification tool components (e.g., layout versus schematic, design rule check, optical process correction, phase shift mask assignment). The hierarchical database includes representations of one or more additional, or intermediate layer structures that are created and used by the verification tool components for operations performed on the design being verified. Designs can include only a single layer; however, the hierarchical database can include one or more intermediate layers for a single layer original design. Use of a single hierarchical database for multiple verification steps streamlines the verification process, which provides an improved verification tool.

Figure 1:
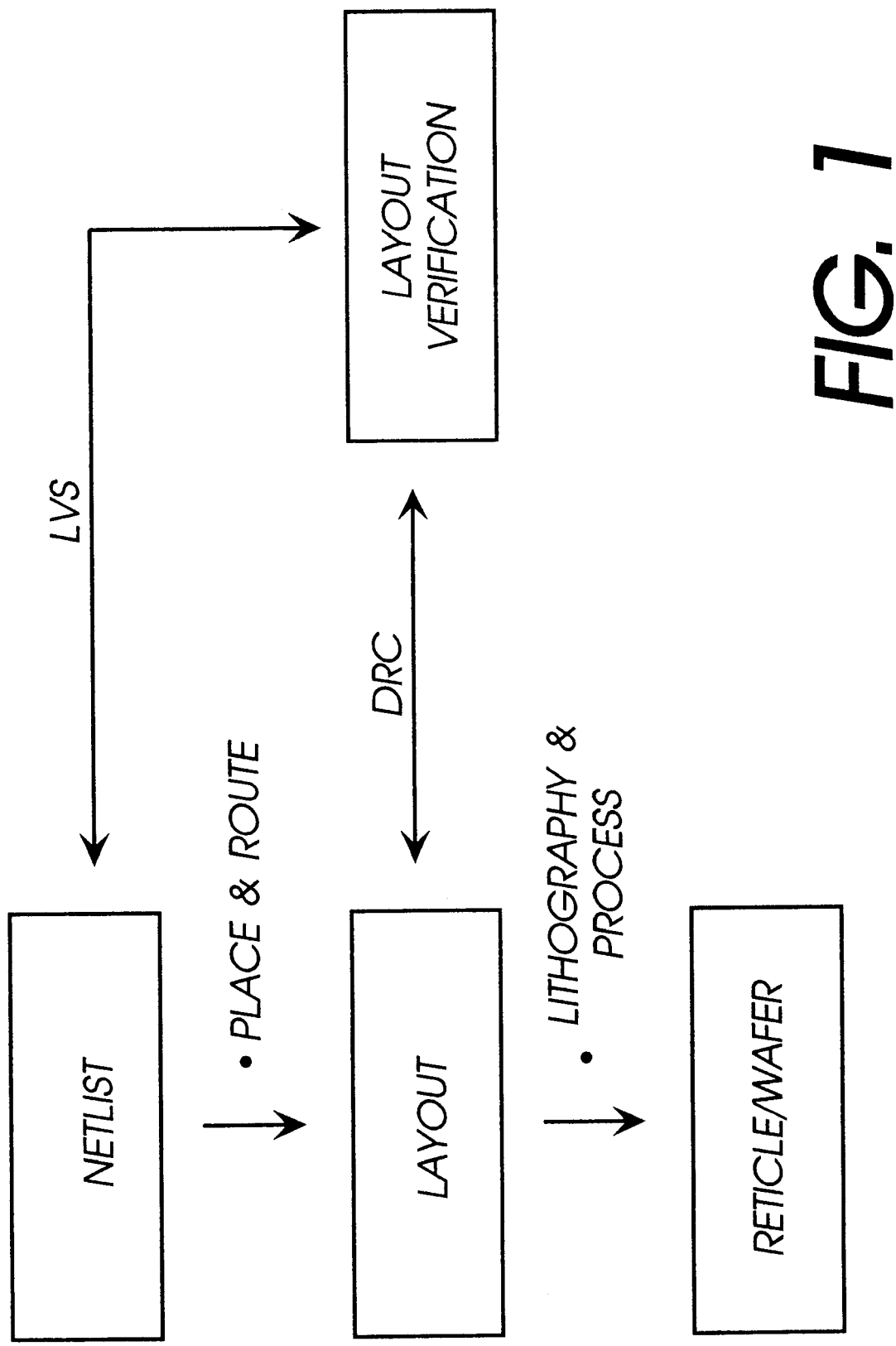
FIG. 1 is representation of standard IC layout design sequence used for verification.
Figure 2:
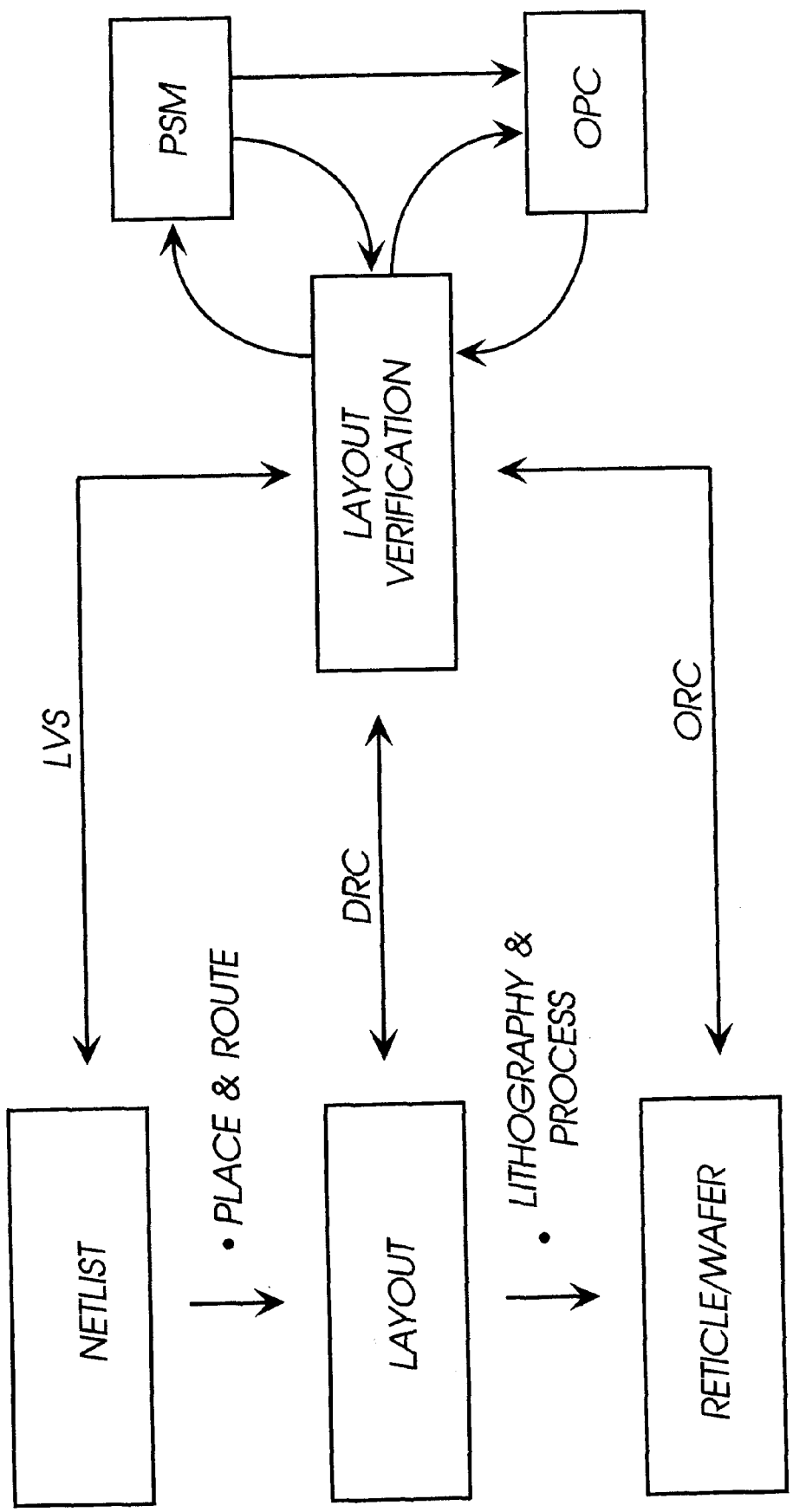
FIG. 2 illustrates a modified flow, which accommodates additional process steps of OPC and PSM generation.
Figure 3:
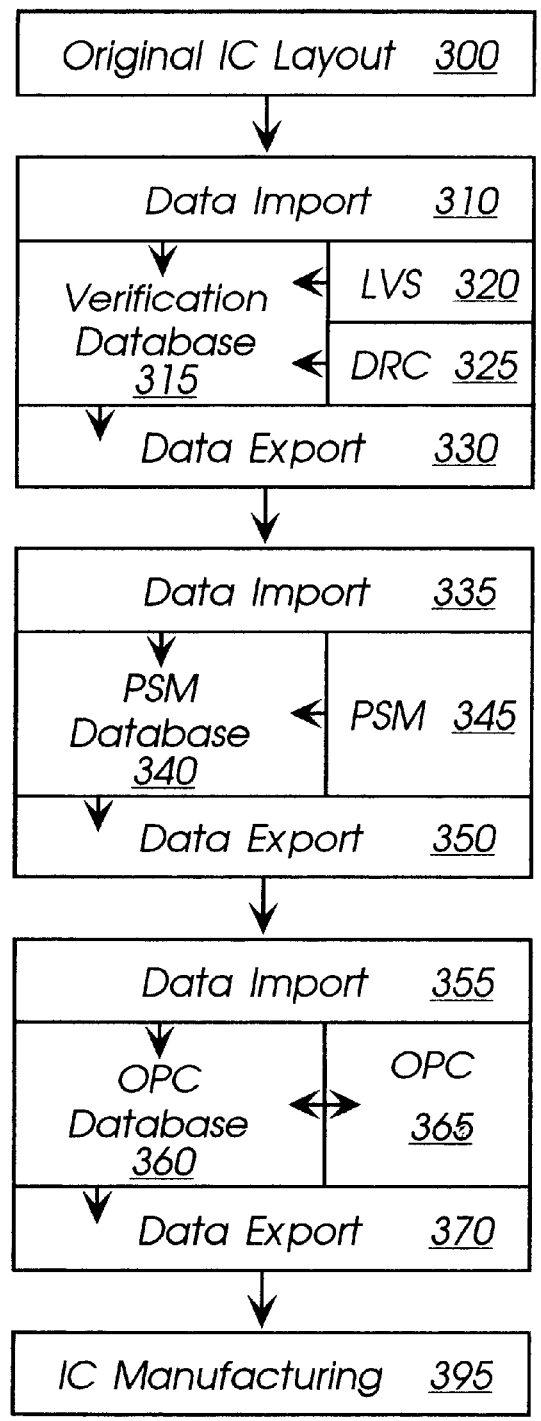
FIG. 3 is a conceptual illustration of a prior art implementation of integrated circuit design verification incorporating these additional steps.
Figure 4:
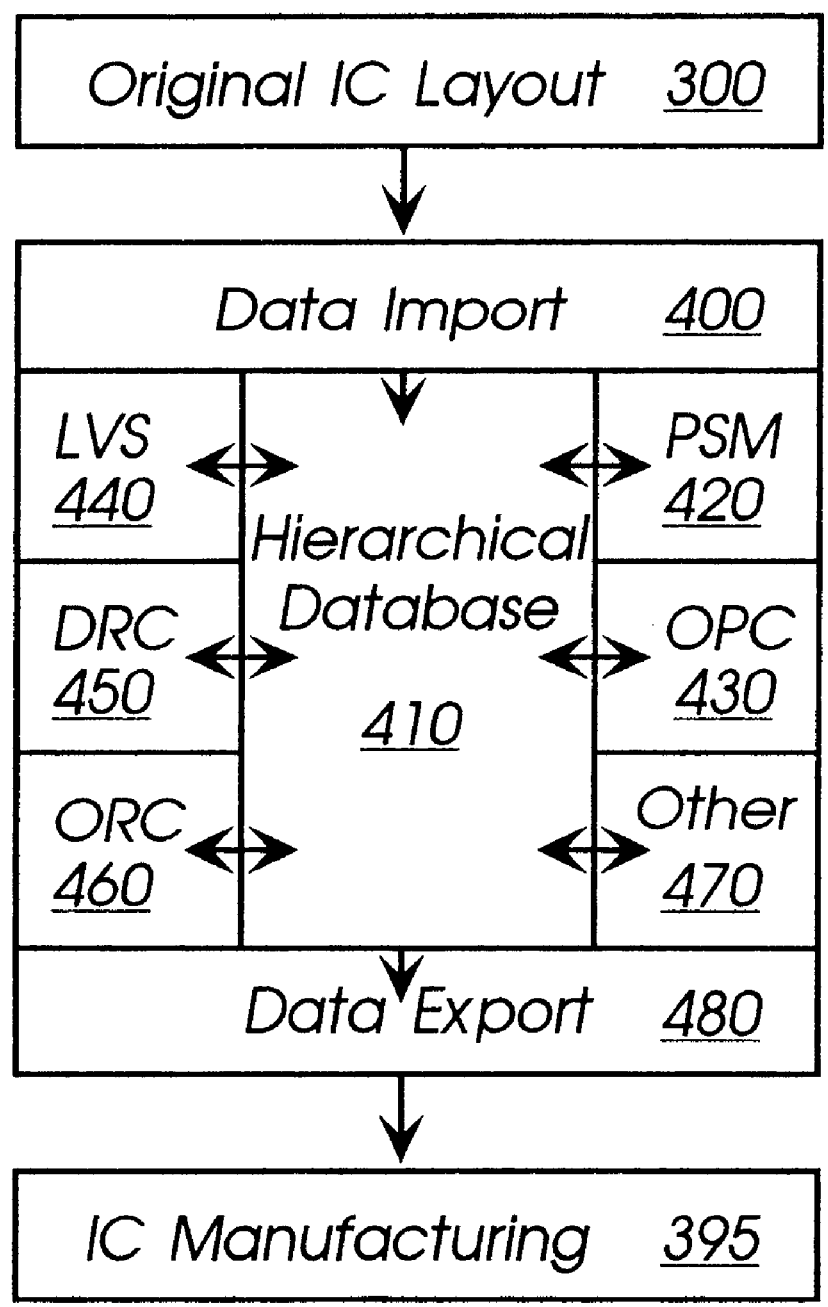
FIG. 4 is a conceptual illustration of an integrated verification and manufacturability tool.

FIG. 4 is a conceptual illustration of an integrated verification and manufacturability. The integrated verification and manufacturability of FIG. 4 includes a single hierarchical database that is used by each component within the tool. For purposes of description, the integrated verification and manufacturability includes a database and multiple components. The components perform the core functionality of the individual stand-alone tools of FIG. 3; however, because they are included in an integrated verification and manufacturability, the components are not referred to as tools. Use of a single database for multiple components reduces the time and effort required for the verification process.

FIG. 4 illustrates an LVS component, a DRC component, an optical rule checking (ORC) component, a PSM component, an OPC component, and an "other" component indicating that additional components can be added to the integrated verification and manufacturability. In alternate embodiments, fewer components can be used, for example, only a DRC and an OPC component might be used.

In one embodiment, the tool scans a listing of desired operations to be performed, sometimes called a "ruledeck", to determine the required inputs and outputs. The tool then reads in the required input layers from the input database and creates empty output layers, to be filled during computation. In addition, several intermediate or "working" layers may be created to hold temporary computation results. In one embodiment, all inputs, outputs and intermediate results are geometry collections called "layers", defined as a collection of geometry in one or more cells of the layout. This definition is the same as a definition of a layer in the well known GDS II database standard format for representing layouts. Layers also allow hierarchical data representation.

Once the hierarchical database is formed and the list of required layers compiled, computations are carried out to fill the desired output layers. After the verification process is complete, the information stored in hierarchical database 410 is exported by data export process 480. The exported data can be used by IC manufacturing process 395 to manufacture the IC design.

LVS component 440, DRC component 450, ORC component 460, PSM component 420, OPC component 430, and any other component(s), as indicated by "other" 470, operate on hierarchical data representing original IC layout 300 as stored in hierarchical database 410. In one embodiment, LVS component 440, DRC component 450, ORC component 460, PSM component 420, OPC component 430 operate on a hierarchical representation of edges that describe original IC layout 300. The various component use the edge representations and the structures in the intermediate layers included in hierarchical database 410 to perform the respective operations.

Another embodiment of an integrated verification and manufacturability tool includes a component that can add arrays of regular features, such as, for example, small squares, to the layout in order to help with the planarization, or physical flatness, of the fabricated silicon. These features are sometimes called "dummy fill" or "planarization fill." By analyzing the density of the features in the layout, low-density areas are identified and filled in with new features.

Figure 5:
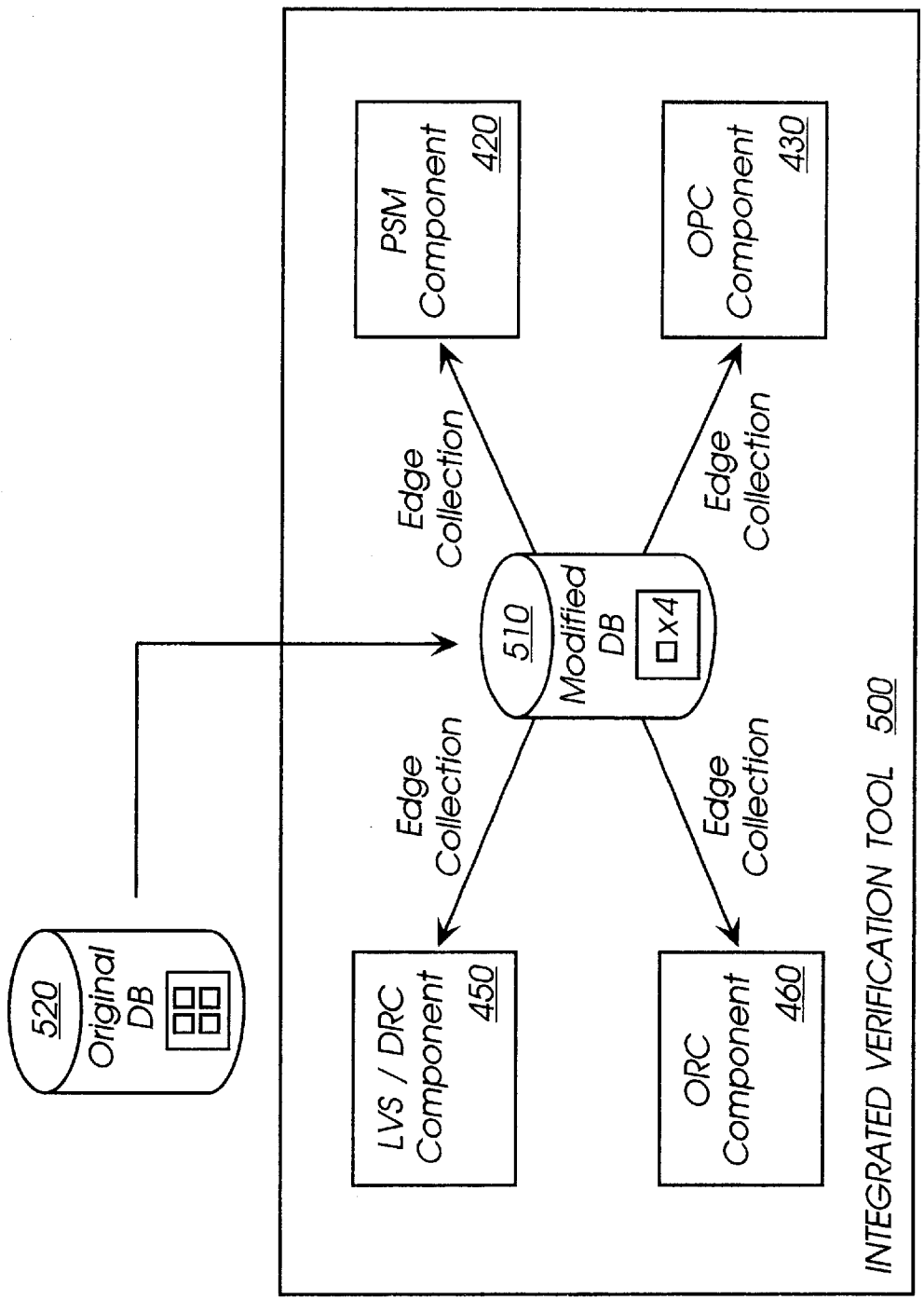
FIG. 5 illustrates operation of one embodiment of an integrated verification and manufacturability tool.

FIG. 5 illustrates operation of one embodiment of an integrated verification and manufacturability. As described in greater detail below, the integrated verification and manufacturability can be executed by one or more computer systems.

In one embodiment, integrated verification and manufacturability 500 imports data from original database 520 into modified database 510. Original database 520 can store the design to be verified in a relatively standard format, for example, GDS-II, while modified database 510 can store the design in a modified standard format, or in an independent format. In one embodiment, importation includes executing hierarchical injection and/or bin injection. In an alternate embodiment, integrated verification and manufacturability 500 receives the data in the modified/independent format.

In general, hierarchical injection is a technique in which recurring patterns of cell placements are recognized and replaced with new cells that contain the patterns. Hierarchical injection creates a more efficient representation of original database 520 by reducing the number of redundant patterns of cell placements, or contexts. In one embodiment, specially designed heuristics are used to recognize the patterns and to determine the correct representation by the new cells.

The heuristics include, for example, the injection of hierarchy into arrays and the selective flattening of densely overlapping structures. In many layouts, arrays of a cell are described inefficiently from a verification perspective. The hierarchical injection heuristics recognize arrays and redefine rows, columns or small sub-arrays as new cells. This added hierarchy reduces the amount of geometry promoted during the computation phase by greatly reducing the number of redundant interactions between placements in the array. In particular types of circuits, for example FPGAs, two large cells or arrays of cells will overlap each other to a large extent. This configuration is called a "dense overlap". Hierarchical injection recognizes such instances and first flattens selected cells that overlap, and then re-introduces new, less interaction-prone cell structures.

Bin injection is a process of dividing flat layout geometry into cells. Bin injection can also be applied to a random collection of cells, to reconfigure the cell structure more efficiently. In one embodiment, bin injection is accomplished by dividing a layout not by cell names, but by geometric grid. Bin injection is one technique for converting a flat layout into a hierarchical layout.

Various importation techniques are described in greater detail in U.S. Pat. application Ser. No. 09/234,030 filed Jan. 19, 1999 entitled "PLACEMENT BASED DESIGN CELLS INJECTION INTO AN INTEGRATED CIRCUIT DESIGN," by Laurence W. Grodd, which is incorporated by reference herein.

Once modified database 510 is generated by hierarchical injection and/or bin injection, each component (e.g., LVS, DRC, PSM, OPC, ORC) operates on groups of geometric figures that represent portions of the layout of the integrated device design. These groups are generally referred to as an "edge collection." An edge collection contains edges from a design that may be organized into polygons, depending on the nature of the operations. Typical edge collections may contain only the edges of a single cell, others may contain the edges of a cell and nearby elements, while others might contain all edges within an arbitrary boundary. Edges may be retrieved from the edge collection either as whole polygons, if the data they represent consists of polygons, or as free edges. Once retrieved and manipulated, new edges representing the output of the operation are stored in a layer from which the edges are retrieved and/or a previously unused intermediate layer in modified database 510.

Selective promotion is a technique in which certain geometries in cells that have an effect on nearby cells are "promoted" to another level of the hierarchy. This promotion prevents the geometry in a cell from having conflicting behavior depending on the placement of the cell. For example, for a cell that has geometry very close to its own border, one placement of this cell may be isolated, but another placement may be close to another cell. In this case, the computed result for the geometry near the border may be different in each placement due to interaction with the nearby cell.

To resolve this conflict, the conflicting geometry close to the border is "promoted", or flattened, to the next level of the hierarchy. This creates two versions of the geometry, one for each placement of the cell, each of which will produce different computational results. By reducing the number of unique interactions and conflicting geometries, the amount of promoted geometry is minimized, resulting in less computation and smaller file size. Promotion can be accomplished recursively.

Manipulation of edge collections, as well as the use of selective promotion facilitates sharing of data between multiple verification tool components without importation and exportation of data between databases. Previous verification tools typically represent IC designs in formats that are optimized for the specific tool without regard for sharing the design database. Sharing of data was accomplished thorough an importation/exportation process.

The hierarchical representation provided by modified database 510 provides several performance advantages. For example, previous verification tools typically used a cell cloning scheme to eliminate redundant contexts. However, some designs resulted in a very large number of clones, which slowed the verification process. Selective promotion and hierarchical injection reduces, or even eliminates, redundant contexts in a more efficient manner, which allows the verification process to be completed more quickly than using a cloning-based technique.

Additionally, cloning techniques are based on the assumption that all inter-cell interactions are local. That is, interaction distances are bounded. However, for phase-shift mask (or reticle) assignment techniques, interaction distances are potentially unbounded. This requires a potentially unbounded number of cell clones, which would make hierarchical phase assignment impractical.

In one embodiment, the integrated verification and manufacturability includes LVS/DRC component 450 that performs both LVS verification operations and DRC verification operations on the edge collection stored in modified database 510. In an alternate embodiment, LVS verification operations and DRC verification operations are performed by separate components.

The LVS verification operations analyze the edge collection to determine whether the layout accurately corresponds to the schematic design. In one embodiment, the edge collection is compared to a netlist corresponding to the design to determine whether the layout accurately represents the netlist representation. Errors identified by the LVS component can be flagged and identified and possibly corrected. In one embodiment, data generated by the LVS component and/or the corrected layout are stored in one or more intermediate layers in modified database 510.

The DRC verification operations analyze the edge collection to determine whether any design rule violations exist. Design rules can include, for example, minimum line spacings, minimum line widths, minimum gate widths, or other geometric layout parameters. The design rules are based on, for example, the manufacturing process to be used to manufacture the resulting design layout. As with the LVS component, errors identified by the DRC component can be flagged and identified and possibly corrected. In one embodiment, data generated by the DRC component and/or the corrected layout are stored in one or more intermediate layers in modified database 510.

In one embodiment, ORC component 460 analyzes the edge collection by simulating the performance expected on the wafer, and determining whether the wafer structures will violate a set of fabrication tolerances. ORC component 460 can also operate on the edge collection that represents the original layout, for example, prior to LVS and DRC being performed on the layout. As with the LVS and DRC components, errors identified by the ORC component can be flagged and identified and possibly corrected.

In one embodiment, PSM component 420 operates on an edge collection as modified by ORC component 460; however PSM component 420 can operate on other edge collections also. PSM component 420 creates phase shifting assignments for reticles of the design stored in modified database 510. Phase shifting assignments can be made, for example, to enable extremely small gate widths and/or line widths. The resulting layers and/or reticle layers are stored in intermediate layers in modified database 510.

In one embodiment, OPC component 430 operates on the edge collection as modified by PSM component 420 as stored in one or more intermediate layers in modified database 510. OPC component 430 can also operate on the edge collection that represents the original layout, for example, if PSM is not performed on the layout.

Two general categories of OPC are currently in use: rule-based OPC and model-based OPC. One or both of which can be applied. In rule-based OPC, a reticle layout is modified according to a set of fixed rules for geometric manipulation. In model-based OPC, an IC structure to be formed is modeled and a threshold that represents the boundary of the structure on the wafer can be determined from simulated result generated based on the model used.

Certain aspects of model-based OPC are described in greater detail in the following publications. Cobb, et al., "Mathematical and CAD Framework for Proximity Correction," *Optical Microlithography IX*, Proc. SPIE 2726, pp. 208–222 (1996); Cobb, et al., "Experimental Results in Optical Proximity Correction with Variable Threshold Resist Model," *Optical Microlithozraphy X*, SPIE 3051, pp. 458–468 (1998); and Nicholas B. Cobb, "Fast Optical and Process Proximity Correction Algorithms for Integrated Circuit Manufacturing," PhD dissertation, Univ. Cal. Berkeley (1998).

OPC component 460 modifies the placement of one or more edges to provide improved optical performance of one or more reticles. One example of rule-based OPC that can be applied to a layout is the addition of assist features, for example, sub-resolution bars along an interconnection line, hammer head shapes at line ends, or serifs at a line corner. Other assist features can also be provided.

OPC component 460 can also modify placement of one or more edges based on models that predict the structures that will be produced using specific reticle layouts. The reticle layouts can be modified based on the results of the prediction to compensate for deficiencies that are identified by the modeling results. In one embodiment, the results generated by OPC component 460 are stored in one or more intermediate layers in modified database 510.

Figure 6:
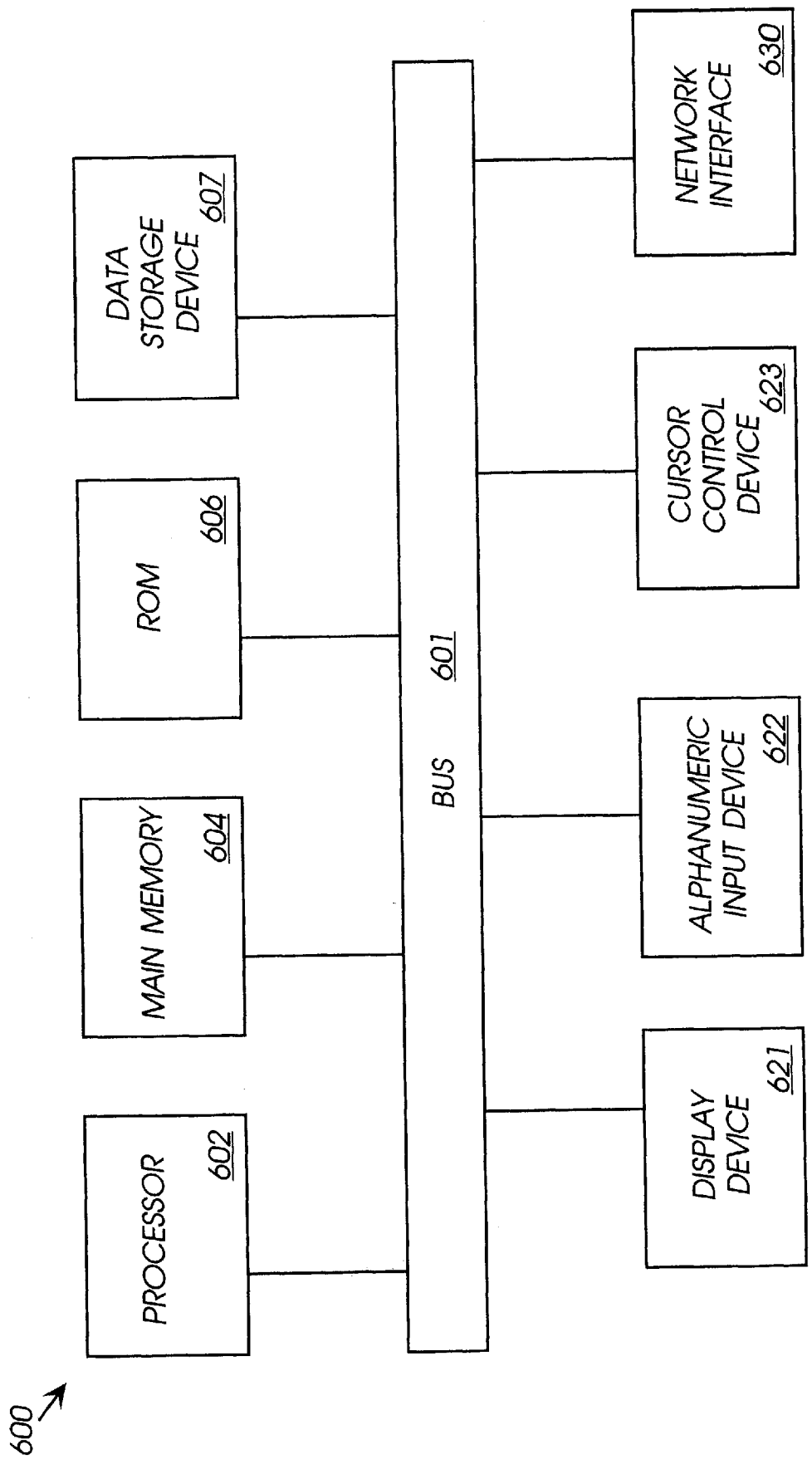
FIG. 6 illustrates one embodiment of a computer system suitable for use to practice the invention.

FIG. 6 is a block diagram of one embodiment of a computer system. The computer system illustrated in FIG. 6 is intended to represent a range of computer systems. Alternative computer systems can include more, fewer and/or different components.

Computer system 600 includes bus 601 or other communication device to communicate information, and processor 602 coupled to bus 601 to process information. While computer system 600 is illustrated with a single processor, computer system 600 can include multiple processors and/or co-processors. In a multiprocessor embodiment, operations performed by the various verification and manufacturability tools are divided by cells, bins or other techniques for dividing work between processors. For example, a single cell is operated upon by a processor while another cell is operated upon by a different processor. When the cell operations are complete, the processor can perform verification operations on another cell.

Computer system 600 further includes random access memory (RAM) or other dynamic storage device 604 (referred to as main memory), coupled to bus 601 to store information and instructions to be executed by processor 602. Main memory 604 also can be used to store temporary variables or other intermediate information during execution of instructions by processor 602.

Computer system 600 also includes read only memory (ROM) and/or other static storage device 606 coupled to bus 601 to store static information and instructions for processor 602. Data storage device 607 is coupled to bus 601 to store information and instructions. Data storage device 607 such as a magnetic disk or optical disc and corresponding drive can be coupled to computer system 600.

Computer system 600 can also be coupled via bus 601 to display device 621, such as a cathode ray tube (CRT) or liquid crystal display (LCD), to display information to a computer user. Alphanumeric input device 622, including alphanumeric and other keys, is typically coupled to bus 601 to communicate information and command selections to processor 602. Another type of user input device is cursor control 623, such as a mouse, a trackball, or cursor direction keys to communicate direction information and command selections to processor 602 and to control cursor movement on display 621.

Computer system 600 further includes network interface 630 to provide access to a network, such as a local area network. According to one embodiment, an integrated verification and manufacturability is provided by one or more computer systems, such as computer system 600, or other electronic devices in response to one or more processors, such as processor 602, executing sequences of instructions contained in memory, such as main memory 604.

Instructions are provided to memory from a storage device, such as magnetic disk, a read-only memory (ROM)

integrated circuit, CD-ROM, DVD, via a remote connection (e.g., over a network via network interface 630) that is either wired or wireless, etc. In alternative embodiments, hard-wired circuitry can be used in place of or in combination with software instructions to implement the present invention. Thus, the present invention is not limited to any specific combination of hardware circuitry and software instructions.

A machine-readable medium includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

Figure 7:
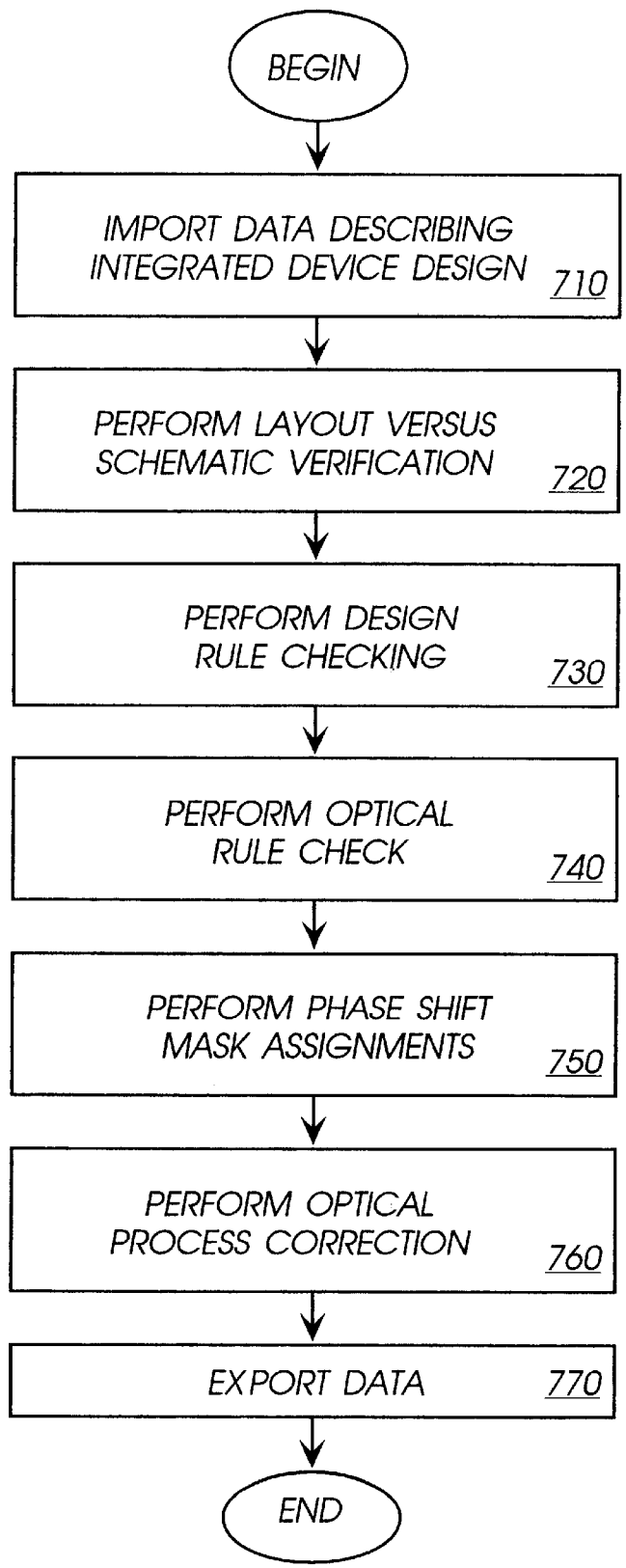
FIG. 7 is a flow diagram of one embodiment of design verification with an integrated verification and manufacturability tool.

FIG. 7 is a flow diagram of one embodiment of design verification with an integrated verification and manufacturability. FIG. 7 illustrated a specific sequence through a specific set of verification procedures. The specific verification procedures and the sequence in which verification is performed can be modified based on, for example, the type of design being verified.

Data describing the integrated device design is imported at 710. In one embodiment, the data is imported from a GDS-IL file; however, other formats can also be used. In general, conversion of data from one format to another, is known in the art. As mentioned above, during importation, intermediate layers are added to the imported data to be stored in a hierarchical database.

In one embodiment, the number of intermediate layers added is determined based on the verification procedures to be performed, and possibly on the sequence in which the verification procedures are performed. One or more intermediate layers are added for each of the verification procedures to be performed. In one embodiment, a job description is analyzed in association with importation of an integrated device design. The job description indicates the verification procedures to be performed and the portions of the design that are to be verified.

Layout versus schematic (LVS) verification is performed at 720. In general, LVS verification compares the original design layout to a netlist that described the interconnections of components within the design. The intermediate layer(s) associated with LVS verification stores the results of the LVS verification. The intermediate layer(s) can store, for example, a description of errors found during LVS verification, or a modified design based on the results of the LVS verification process.

Design rule checking (DRC) is performed at 720. DRC searches the design for violations a predetermined set of conditions (e.g., minimum line widths, minimum separations) and returns a result indicating whether design rule violations were found. The intermediate layer(s) associated with DRC can store, for example, a list of design rule errors found, or a modified design that satisfies the design rules. Optical rule checking (ORC) is performed at 740. In one embodiment, the ORC is performed on one or more simulated integrated device layers.

In one embodiment, ORC includes "flagging" edges in a layout that are predicted to result in silicon printability errors. In another embodiment, simulated silicon shapes are generated from the layout, and then DRC is performed on the simulated silicon shapes. This can be thought of as "silicon DRC" or another application ORC.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A verification and manufacturability tool comprising:
    a database to store data representing at least a portion of an integrated device layout;
    a checking component to use a data format to perform checking operations on the integrated device design by accessing the database; and
    an optical process correction (OPC) component to use the data format to perform OPC operations on the integrated device layout by accessing the database.

2. The verification and manufacturability tool of claim 1 wherein the checking component comprises a layout versus schematic (LVS) component.

3. The verification and manufacturability tool of claim 1 wherein the checking component comprises a design rule checking (DRC) component.

4. The verification and manufacturability tool of claim 1 further comprising a phase shift mask (PSM) component to use the data format.

5. The verification and manufacturability tool of claim 1 further comprising an optical rule checking (ORC) component to use the data format.

6. The verification and manufacturability tool of claim 1 wherein the OPC component and the checking component operate on sets of edges that represent a portion of the integrate device layout.

7. The verification and manufacturability tool of claim 1 wherein the integrated device layout is an integrated circuit (IC) layout.

8. The verification and manufacturability tool of claim 1 wherein the hierarchical database includes one or more intermediate layers.

9. The verification and manufacturability tool of claim 8 wherein a number of intermediate layers to be included in the hierarchical database is determined based, at least in part, on operations to be performed on the integrated device layout.

10. The verification and manufacturability tool of claim 1 wherein the database comprises a hierarchical database to represent at least a portion of the integrated device in a hierarchical manner.

11. An integrated circuit manufactured using the tool of claim 1.

12. A method comprising:
    importing an integrated device layout into a database;
    performing layout verification operations on the integrated device layout using a data format; and
    performing optical process correction (OPC) operations on the integrated device layout using the data format.

13. The method of claim 12 wherein performing layout verification operations comprises performing layout versus schematic (LVS) operations on the integrated device layout.

14. The method of claim 12 wherein performing layout verification operations comprises performing design rule checking (DRC) operations on the integrated device layout.

15. The method of claim 12 wherein performing layout verification operations comprises performing design rule checking (DRC) operations on simulated silicon edges.

16. The method of claim 12 further comprising a phase shift mask (PSM) operations on the integrated device layout using the data format.

17. The method of claim 12 further comprising performing optical rule checking (ORC) operations on the integrate device layout using the data format.

18. The method of claim 12 wherein importing an integrated device layout into the hierarchical database comprises analyzing an original integrated device layout for redundant patterns and replacing one or more of the redundant patterns with cells that include the redundant patterns.

19. The method of claim 12 wherein importing an integrated device layout into the hierarchical database comprises converting one or more portions of the layout comprising a single layer to one or more portions of the layout comprising multi-level hierarchical layouts.

20. The method of claim 12 wherein the layout verification operations and the optical process correction (OPC) operations are performed on a set of edges that represent portions of the integrated device layout.

21. The method of claim 12 wherein the integrated device layout comprises and integrated circuit (IC) layout.

22. The method of claim 12 wherein the database comprises a hierarchical database representing the integrated device in a hierarchical manner.

23. An integrated circuit designed using the method of claim 12.

24. A machine-readable medium having stored thereon sequences of instructions that, when executed, cause one or more electronic systems to:
   import an integrated device layout into a database;
   perform layout verification operations on the integrated device layout using a data format; and
   perform optical process correction (OPC) operations on the integrated device layout using the data format.

25. The machine-readable medium of claim 24 wherein the sequences of instructions that cause one or more electronic systems to perform layout operations comprises sequences of instructions that, when executed, cause the one or more electronic system to perform layout versus schematic (LVS) operations on the integrated device layout.

26. The machine-readable medium of claim 24 wherein the sequences of instructions that cause the one or more electronic systems to perform layout operations comprises sequences of instructions that, when executed, cause the one or more electronic systems to perform design rule checking (DRC) operations on the integrated device layout.

27. The machine-readable medium of claim 24 further comprising sequences of instructions that, when executed, cause the one or more electronic systems to perform phase shift mask (PSM) operations on the integrated device layout using the data format.

28. The machine-readable medium of claim 24 further comprising sequences of instructions that, when executed, cause the one or more electronic systems to perform optical rule checking (ORC) operations on the integrate device layout using the data format.

29. The machine-readable medium of claim 24 further comprising sequences of instructions that, when executed, cause the one or more electronic systems to perform optical rule checking (ORC) operations on simulated silicon edges using the data format.

30. The machine-readable medium of claim 24 wherein the sequences of instructions that cause the one or more electronic systems to import an integrated device layout into the hierarchical database comprises sequences of instructions that, when executed, cause the one or more electronic systems to analyze an original integrated device layout for redundant patterns and replace one or more of the redundant patterns with cells that include the redundant patterns.

31. The machine-readable medium of claim 24 wherein the sequences of instructions that cause the one or more electronic systems to import an integrated device layout to the hierarchical database comprises sequences of instructions that, when executed, cause the one or more electronic systems to convert one or more portions of the layout comprising a single layer to one or more portions of the layout comprising multi-level hierarchical layouts.

32. The machine-readable medium of claim 24 wherein the layout verification operations and the optical process correction (OPC) operations are performed on a set of edges that represent portions of the integrated device layout.

33. The machine-readable medium of claim 24 wherein the integrated device layout comprises an integrated circuit (IC) layout.

34. The machine-readable medium of claim 24 wherein the database comprises a hierarchical database to represent the integrated device in a hierarchical manner.

35. An electronic data signal embodied in a data communications medium shared among a plurality of network devices comprising sequences of instructions that, when executed, cause one or more electronic systems to:
   import an integrated device layout into a database;
   perform layout verification operations on the integrated device design using a data format; and
   perform optical process correction (OPC) operations on the integrated device design using the data format.

36. The electronic data signal of claim 35 wherein the sequences of instructions that cause the one or more electronic systems to perform layout operations comprises sequences of instructions that, when executed, cause the one or more electronic systems to perform layout versus schematic (LVS) operations on the integrated device layout.

37. The electronic data signal of claim 35 wherein the sequences of instructions that cause the one or more electronic systems to perform layout operations comprises sequences of instructions that, when executed, cause the one or more electronic systems to perform design rule checking (DRC) operations on the integrated device layout.

38. The electronic data signal of claim 35 further comprising sequences of instructions that, when executed, cause the one or more electronic systems to perform phase shift mask (PSM) operations on the integrated device layout using the data format.

39. The electronic data signal of claim 35 further comprising sequences of instructions that, when executed, cause the one or more electronic systems to perform optical rule checking (ORC) operations on the integrated device layout using the data format.

40. The electronic data signal of claim 35 further comprising sequences of instructions that, when executed, cause the one or more electronic systems to perform optical rule checking (ORC) operations on simulated silicon edges using the data format.

41. The electronic data signal of claim 35 wherein the sequences of instructions that cause the one or more electronic systems to import an integrated device layout to the hierarchical database comprises sequences of instructions that, when executed, cause the one or more electronic systems to analyze an original integrated device design for redundant patterns and replace one or more of the redundant patterns with cells that include the redundant patterns.

42. The electronic data signal of claim 35 wherein the sequences of instructions that cause the one or more electronic systems to import an integrated device layout to the hierarchical database comprises sequences of instructions that, when executed, cause the one or more electronic systems to convert one or more portions of the layout comprising a single layer to one or more portions of the layout comprising multi-level hierarchical layouts.

43. The electronic data signal of claim 35 herein the layout verification operations and the optical process correction (OPC) operations are performed on a set of edges that represent portions of the integrated device layout.

44. The electronic data signal of claim 35 wherein the integrated device design comprises an integrated circuit (IC) layout.

45. The electronic data signal of claim 35 wherein the database comprises a hierarchical database to represent the integrated device in a hierarchical manner.

* * * * *